United States Patent [19]
Grunwald et al.
[11] 3,784,440
[45] Jan. 8, 1974

[54] ALUMINUM-CLAD PLASTIC SUBSTRATE LAMINATES

[75] Inventors: John H. Grunwald, New Haven; Eugene D. D'Ottavio, Thomaston; Harold L. Rhodenizer, Bethlehem; Michael S. Lombardo, Waterbury, all of Conn.

[73] Assignee: MacDermid, Incorporated, Waterbury, Conn.

[22] Filed: Nov. 9, 1971

[21] Appl. No.: 197,161

Related U.S. Application Data

[62] Division of Ser. No. 889,472, Dec. 31, 1969, Pat. No. 3,620,933.

[52] U.S. Cl. .................... 161/185, 117/49, 156/3, 161/186, 161/215, 161/217, 161/218, 161/219, 161/225, 204/15

[51] Int. Cl. ... B32b 15/08, B32b 15/20, H05k 1/00

[58] Field of Search ........................ 156/3; 117/49; 161/215, 225, 185, 186, 216, 219, 196, DIG. 7; 204/15

[56] References Cited

UNITED STATES PATENTS

| | | | |
|---|---|---|---|
| 3,337,426 | 8/1967 | Celto | 204/15 |
| 3,349,014 | 10/1967 | Hyter | 204/15 |
| 2,552,285 | 5/1951 | Knewstubb et al. | 161/225 X |
| 2,003,752 | 6/1935 | Landt | 161/215 |
| 3,143,364 | 8/1964 | Klein | 161/216 X |
| 3,287,197 | 11/1966 | Errede | 161/216 X |
| 3,318,758 | 5/1967 | Tell | 161/216 |
| 3,450,595 | 6/1969 | Salter et al. | 161/215 |
| 3,701,711 | 10/1972 | Kelly | 161/215 X |

*Primary Examiner*—Harold Ansher
*Attorney*—Merrill F. Steward et al.

[57] ABSTRACT

Plastic parts are formed against an anodically treated aluminum surface by molding, laminating, etc., to produce laminates useful, after removal of or separation from the aluminum, in providing a plastic surface of a high energy level promoting greater adhesion of deposited metal conductor circuits in the additive process of making printed circuit boards.

7 Claims, No Drawings

ALUMINUM-CLAD PLASTIC SUBSTRATE LAMINATES

This application is a division of copending application Ser. No. 889,472, filed Dec. 31, 1969, now U.S. Pat. No. 3,620,933.

This invention relates to laminates comprising parts which are formed against an anodically treated aluminum surface by molding, laminating, etc., whereby the surface of the formed part after removal of or separation from the aluminum has a high energy level and is receptive to electroless and electrolytic deposits of metal plate, as in the production of electronic circuit boards. The laminates are prepared by bonding anodically treated aluminum foil to a self-supporting, preformed plastic substrate to provide a sacrificial cladding on the substrate, which when stripped chemically from the substrate, and the stripped surface then catalyzed, affords a particularly advantageous surface for reception thereon of a conductor metal plate in the desired conductor circuit configuration produced directly by electroless and/or electrolytic deposition.

Two distinct methods of manufacture of printed circuit boards for use in electronic equipment have, in general, been proposed in the prior art. One is termed the "subtractive" method and is the one used predominantly at the present time. The other method is called the "additive" procedure.

The manufacture of the printed circuit by the subtractive method starts with a laminate or composite consisting of a sheet of insulating material as a base or substrate, one or both sides being covered with a thin copper foil on the order of 0.001 inch to 0.003 inch thick. The foil is secured to the insulating base by means of an appropriate adhesive or by the application of heat and pressure in forming the laminated structure. The substrate or insulating base used to support the conductive circuit is usually made in the form of a flat sheet of compression molded epoxy-glass or phenolic resin material.

After the configuration of the desired electric circuit to be printed on the board has been designed, the "art work" is prepared which consists of a positive or negative transparency or silk screen bearing the desired circuit image. In the photographic reproduction method, the copper-sheathed plastic substrate is covered with a photosensitive resist, this being generally a liquid polymeric preparation which includes light-sensitive initiators and becomes solvent-resistant after exposure to ultraviolet radiation. A latent image of the desired circuit is formed in the photoresist on the surface of the board by exposure through the transparency, and this image is developed in an appropriate solvent which removes the unexposed photoresist material. Using the silk screen, a chemical resist is squeegeed through the screen onto the board to give the desired pattern. In this subtractive method, therefore, the resist coating formed on the board is a positive image of the desired circuit so that the copper foil to be retained on the surface of the board is protected with photoresist material. The remaining portion of the copper foil, corresponding to the non-circuit areas of the final printed board, is left unprotected and is then etched away in a suitable solution, commonly ferric chloride or an ammoniacal solution of the type described in U.S. Pat. No. 3,231,503. The resulting circuit board containing the desired circuit configuration is then treated in a suitable solvent to strip the remaining resist coating on the retained copper foil, and is ready for additional plating or solder application, mounting of accessory electronic components, etc.

In a modification of this procedure, where a circuit board is provided with copper laminates on both sides and it is desired to form conductor circuits on these opposite faces with electrical interconnection between certain areas on the opposite faces, through-holes are drilled or punched through the boards as required, and the walls of these holes are plated with a metal to electrically interconnect the opposed surface conductor areas. Therefore before the copper-clad boards can be put through the subtractive method of forming the desired printed circuits on their opposite faces, they must be subjected to a series of operations designed to plate a thin deposit of copper, nickel, etc., on the walls of the through-holes to join the surface conductor areas. The procedure here is well-known in the art and generally involves punching the holes, cleaning the copper-clad faces of the laminate, light etching or pickling and then catalyzing, followed by electroless deposition (or in some cases by direct electrodeposition) of copper over the entire exposed surface, including the non-conductive walls of the through-holes in the plastic substrate as well of course as the copper-clad faces of the substrate. After applying a circuit pattern of organic or polymeric masking resist, the conductor area (i.e. circuit areas) are electrolytically plated with conductor metal to desired thickness and then covered with a metallic resist (e.g. tin-lead). The organic resist is then stripped by a suitable solvent, leaving the non-circuit areas of copper exposed, and this is then removed by a suitable acid or alkali etchant solution.

A major drawback of the foregoing subtractive method arises from the occurrence during etching away of the non-circuit areas of the phenomenon known as "undercut" in the metal remaining on the board. Undercut is the term of art employed to describe the lateral undermining of the conductor area in the resulting circuit configuration formed on the surface of the board. In fact, this phenomenon of undercutting greatly limits the fineness or narrowness of the conductor areas that can be tolerated; that is, these conductor areas must be over-designed from a width standpoint to allow for such undercut. This of course impedes attempts toward further miniaturization of the circuit boards. Also, where the nature of the circuit requires the use of the heavier or thicker copper foil on the surface of the plastic substrate, a longer residence time of the board in the etching solution must be maintained, during which there is an inherent tendency for the resist material itself to be undermined and partially removed in some areas of the board, thereby causing rejects.

Thus the problem in following the so-called subtractive method of producing printed circuit boards is one of greatly limiting the design, insofar as space requirements are concerned, of the desired printed circuits.

Another major disadvantage of the subtractive method is that the copper-clad board is expensive and in preparing the printed circuit board all but a small fraction of the initial copper cladding is etched away completely. Substantial quantities of the acid etching solutions are utilized in stripping away the excess copper. The depleted copper-laden etchant solutions, which are hazardous to handle, can be treated to recover the valuable copper content. However, because of the complexity of such operations, the actual savings resulting is usually small compared to the initial cost of the copper-clad board. The typical manufacturer of printed circuit boards is generally not equipped to operate such metal recovery processes. Alternatively, the waste etchant solutions can be discarded after being subjected to appropriate waste treatment operations which are expensive and time consuming, but in such case of course the value of the copper contained in the etchant solutions is lost.

An alternative to the subtractive process discussed above has been proposed heretofore, and is known as the additive method of manufacturing such boards. This procedure starts with a non-conductive substrate, usually in plaque or sheet form of sufficient thickness to be self-supporting. This substrate is free of any copper foil, and a masking resist circuit pattern is applied so that only areas of the substrate ultimately to be made conductive are exposed. These exposed areas are catalyzed and then plated. The procedure obviously presents a number of advantages over the subtractive method and many attempts have been made to produce suitable additive circuit boards. To date, however, these attempts have not been broadly accepted in commercial production. The major obstacle to a successful additive printed circuit board is the difficulty of obtaining adequate adhesion between the chemically deposited copper or other conductive metal and the dielectric substrate. One of the more recent procedures that has been developed is described in "Transactions of the Institute of Metal Finishing", 1968, Vol. 46, pages 194–197. The procedure there described involves the successive steps of treating the surface of the bare substrate board with a "keying" agent, punching the board to provide the necessary through-holes, plating a very thin initial deposit of nickel over the entire surface using an electroless nickel bath, then applying and developing a resist to form a negative image of the desired circuit pattern, followed by additional metal plating by conventional electrodeposition techniques to build up the conductor portions of the circuit to the desired thickness. After this the resist is stripped and the printed circuit board is etched to completely strip away the initial, thin, electroless metal deposit from the non-circuit areas, leaving only the heavier plate, i.e. the circuit areas, on the board. The board is then treated in the usual way to provide a protective film of precious metal or lacquer on the printed conductor circuit, or alternatively to cover this with a solder coating to facilitate connection of the usual accessory electronic components incorporated into the finished circuit board.

The foregoing method has certain advantages, particularly in that it facilitates electrodeposition of electrically non-continuous circuits and avoids or reduces the need of further electroless plating operations. However, a difficulty with this method resides in its use of a keying agent which, although not fully identified in the foregoing article, appears to be an adhesive polymeric coating. Careful preparation and application of this coating material is required in order to obtain effective and consistent results. Furthermore, as in most cases where attempts have been made to use adhesives as intermediates for bonding copper or other conductor metals to a plastic substrate, there are always problems in obtaining proper dielectric properties of the adhesive, accurate and consistent reproducibility of the polymeric bonding material, and avoiding fragility or brittleness of the bond, to name but a few. It appears also that the reference process is better suited to thermo-plastic resin substrates rather than thermo-setting substrates, although the latter are much preferred for electronic applications.

One of the primary contributions of this invention, accordingly, is to provide an aluminum-clad plastic laminate useful for the additive method of preparing printed circuit boards wherein the use of polymeric adhesive coatings is obviated and yet satisfactory adhesion of the copper or other conductive metal to the dielectric substrate is produced upon plating.

Another contribution of this invention is to provide laminates comprising aluminum sheet or foil bonded to a preformed thermoset or thermoplastic resin substrate which, in addition, to being useful in preparing circuit boards may be advantageously employed in a number of other applications. For example, a laminate of this invention comprising aluminum foil bonded to a thermoplastic sheet, such as sheet of polycarbonate, after stripping of the aluminum foil yields a plastic sheet having a surface receptive to an adherent coating of paint or to plated metal coatings.

The use of aluminum-clad laminates in preparing circuit boards offers a number of advantages over the copper laminate board employed in known additive circuit board processes such as that set forth in Rhodenizer, Grunwald, and Innes application Ser. No. 823,354, filed May 9, 1969 now U.S. Pat. No. 3,669,549. For example, aluminum is cheaper than copper and it is easier to strip from the plastic substrate.

In brief, the procedure in using laminates of this invention for circuit boards manufacture involves first preparing a metal clad plastic laminate having a sheet or foil of aluminum bonded to a preformed, self-supporting plastic substrate by heat and/or pressure in the manner commonly employed today in preparing blank circuit boards for use in the subtractive method, the aluminum however being subsequently stripped to provide a dielectric surface onto which the printed circuit can then be deposited with good adhesion.

PREPARATION OF THE ALUMINUM FOIL

In preparing a circuit board laminate, the first operation involves treating the aluminum sheet or foil anodically in an electrolytic bath containing from about 10–60 percent by weight of phosphoric acid at a temperature of about 70° F. to about 130° F., for about 1 to about 30 minutes or more and at a current denisty of about 10 a.s.f. (amperes per square foot) to about 75 a.s.f. Preferably, the anodic workpiece is treated at about 90° – 110°F. For about 3 to about 7 minutes at 25 to about 55 a.s.f. in an electrolytic bath containing about 20 to about 40 percent by weight of phosphoric acid. The resulting product is aluminum sheet or foil with a tough, adherent coating which is believed to be an oxide coating on its surfaces.

Aluminum alloys, such as aluminum-copper, aluminum-magnesium, aluminum-copper-magnesium-zinc, etc., as well as pure aluminum foil and sheet may be utilized in preparing the aluminum-clad laminates of this invention. The thickness of the aluminum metal can be varied over a wide range and generally will be from about 0.001 to about 0.0098 inch or more and, preferably, will be about 0.001 to about 0.003 inch.

PREPARATION OF LAMINATES

The laminates of the present invention can be prepared using a wide variety of plastic substrates well known in the art. Useful plastics include those prepared from both thermoplastic and thermosetting resins. Typical thermosetting resins which are useful in this invention are the phenolic type materials, such as the copolymers of phenol, resorcinol, a cresol, or a xylenol with formaldehyde or furfural. Polyesters, prepared by reacting dicarboxylic compounds with dihydric alcohols such as the reaction products of phthalic or maleic anydride with mono-, di- or polyethylene glycols, form a suitable class of thermosetting resins. An especially valuable class of thermosetting resins include the epoxy resins such as the reaction product of epichlorohydrin and bisphenol A. Thermoplastic materials suitable for use in this invention include polyolefins, such as polypropylene; polysulfones, acrylonitrile-butadiene-styrene copolymer or ABS, polycarbonate, polyphenylene oxides, etc.

Thermosetting resins employed in preparing one type of the novel laminates of this invention are utilized in the form of thin sheets of resin known as prepegs. In the prepegs the thermosetting resins are in a partially cured condition known as the B-stage and they are still fusible under heat and pressure. Resins in the B-stage can be completely cured by the application of sufficient heat and pressure to yield tough, infusible thermoset materials. Usually, the thin sheets of thermosetting resin employed, i.e., the prepegs, contain reinforcing elements which can be such materials as glass fibers, asbestos, mica, paper, nylon fiber, etc. Generally, the reinforcing elements comprise from about 30 to about 60 percent by weight of the reinforced plastic. A typical polyester or epoxy reinforced laminate with a thickness of 0.125 ± 0.005 inch and a resin content of about 38 ± 2 percent has 12 plies of glass fabric. The tensile strength of such a laminate is about 50,000 p.s.i. and the compression strength is about 62,000 p.s.i. (dry). The preferred reinforcing agent is glass fiber and glass fiber is defined as any fibrous glass unit including filament yarns, rovings, reinforcing mats, stable yarns, woven fabrics and chopped fibers. Woven fabrics of glass cloth may be heat treated or chemically treated with a chrome acrylate complex, an amine functional silane or an epoxy functional silane which act as coupling agents between the glass and the resin and improve the adhesion of the resin binder and the glass.

In the process of this invention any thermosetting resin capable of forming a B-stage or partially cured resin which is essentially tackfree and still fusible under heat and pressure and which is capable of being further cured by the further application of heat and pressure to give a tough, infusible thermoset resin substrate can be utilized. A wide variety of thermosetting resins useful in preparing the laminates of this invention are known in the art. For example, suitable phenolic resins are described in U.S. Pat. Nos. 2,606,855; 2,622,045; 2,716,268 and 2,757,443. Suitable epoxy resins and polyester resins are described in U.S. Pat. Nos. 3,335,050; 3,399,268, etc. The preparation of a suitable prepeg sheet containing a thermosetting resin in the B-stage is described in U.S. Pat. No. 3,433,888.

A laminate suitable for use in the additive circuit board process of this invention is prepared, for example, by placing the B-stage thermosetting epoxy coated and impregnated glass fabric sheet in a laminating press on top of a foil of aluminum having an anodically treated surface abutting the resin and afterwards further curing the thermosetting resin under the influence of heat and pressure. If a laminate clad on both sides with metal foil is desired, it can be prepared in the same manner by placing sheets of the aluminum foil above and below the sheet of partially cured, i.e., B-stage, thermosetting resin in the laminating press in such a way that the anodically treated surfaces contact the resin sheet. Where the laminate is clad on one side only, a sheet of aluminum (unoxidized) foil is utilized to prevent adherence or sticking of the thermosetting resin sheet to the platen of the laminating press.

The actual bonding of the B-stage thermosetting resin sheet to the anodically treated aluminum surface is accomplished by simultaneously pressing the laminating components together and baking at a temperature of about 250° to about 450°F. and preferably at 300°F. at a pressure of about 5 to about 1,000 p.s.i.g. and for a period of time ranging from about 5 minutes to about 30 minutes. During the laminating process it may be necessary to water cool the laminate under the pressure applied in order to promote temperature control of the resin during the curing cycle.

Bonding of a thermoplastic substrate to the aluminum foil is carried out by pressing together a sheet of the thermoplastic material and aluminum foil having an anodically treated surface next to the plastic in a preheated laminating press at a pressure which is generally about 100 to about 1,000 p.s.i.g. and at a temperature of about 150° to about 350°F. or more. The time of the pressing operation may be varied over a wide range and generally will be from about 0.5 to about 10 minutes or more depending upon the particular plastic utilized and the pressure employed. Alternatively, the thermoplastic sheet and the aluminum foil are placed so that the anodically treated surface of the aluminum abuts the surface of the plastic in a lamination press preheated to a temperature of from about 150° to about 350°F. or higher depending on the nature of the plastic. The press is closed and brought up to an initial pressure of about 150 to about 500 p.s.i. after which the pressure is allowed to decrease to 0 p.s.i.g. as the plastic softens and flows, at which point the laminate is removed from the press.

The metal foil thickness can be varied widely as previously pointed out although, preferably, it will be from about 0.001 to about 0.003 inch in thickness. In a like manner, the thickness of the thermosetting or thermoplastic resin sheet utilized may vary from about 0.0015 to about 0.125 inch or more.

The following examples illustrate the preparation of a variety of laminates of this invention and are to be considered not limitive.

EXAMPLE I

A sheet of aluminum foil having a thickness of about 0.002 inch is immersed in an alkaline soak cleaner bath for about 5 minutes at a temperature of 190°F. to remove surface grime and oils. The clean aluminum foil is then preferably etched in ammonium bifluoride at room temperature for 3 minutes and then treated anodically in an electrolytic bath containing 10 weight percent phosphoric acid for 10 minutes at a current density of 10 a.s.f. and at a temperature of 110°F.

The anodically treated aluminum foil is then placed in a laminating press on top of a sheet of an epoxy B-stage resin having a thickness of about 0.003 inches. A sheet of cellophane is placed between the epoxy resin and the platen in order to prevent sticking during the curing operation.

The press, preheated to a temperature of 350°F. is closed and the laminate components are heated at a pressure of about 5 p.s.i. for about 30 seconds after which the pressure is raised to 250 p.s.i. and curing is continued at the same temperature for about 15 minutes. The result is an aluminum-clad laminate in which the aluminum foil is firmly adhered to the cured, hard, infusible thermoset resin substrate.

EXAMPLE II

A sheet of aluminum having a thickness of about 0.001 inch is anodically treated in a bath containing 30 weight percent of phosphoric acid for about 1 minute at 40 a.s.f. and a temperature of 90°F. Prior to the anodic treatment, the aluminum sheet is immersed in an alkaline soak cleaner for a period of about 10 minutes at 100°F. in order to remove surface soils.

Two sheets of the thus-anodically treated aluminum are placed above and below a sheet of partially cured XXXP phenolic (B-stage) on the platen of a laminating press. Each of the aluminum sheets is arranged so that an anodically treated surface contacts the plastic sheet. The laminate is formed by heating the laminate components at a pressure of about 500 p.s.i. and a temperature of about 350°F. for 25 minutes. The result is a laminate clad on both sides with firmly-bonded aluminum foil and having a cured, hard, infusbile phenolic substrate base.

EXAMPLE III

In this example a sheet of aluminum foil having a thickness of 0.003 inch is first immersed in a solution of trichlorethylene at room temperature for about 1 minute following which it is etched in 30 percent by vol. hydrochloric acid for 15 seconds at 85°F. The thus-cleaned aluminum foil is then anodically treated in a bath containing about 60 percent by weight of phosphoric acid at 50 a.s.f. for about 5 minutes at 75°F.

Two sheets of the anodically treated aluminum foil are placed above and below an epoxy resin (B-stage) prepared from epichlorohydrin and bisphenol A in the presence of an acid curing agent. The B-stage resin is self-supporting dry, non-tacky and non-adherent and can be handled without difficulty. The aluminum foil sheets are placed in the laminating press in such a manner that anodically treated surfaces thereon contact the thermosetting resin.

The laminating press is closed and the platens heated gradually to a temperature of 350°F. after which the laminating components are maintained at that temperature for about 20 minutes at a pressure of 500 p.s.i.

Examination of the resulting laminate indicates that the aluminum sheets are strongly bonded to the cured thermoset substrate.

EXAMPLE IV

Aluminum foil (Type 1145, H-18 — 0.0025 inch in thickness) was treated anodically in an aqueous electrolytic bath containing 30 percent by weight of phosphoric acid at 100°F. for 5 minutes at a current density of 40 a.s.f.

A sheet of the anodically treated aluminum foil was placed in a laminating press preheated to a temperature of 325°F. on the upper surface of a sheet of polypropylene (titanium dioxide filled) having a thickness of 0.006 inch. The aluminum sheet was positioned so that an anodically treated surface contacts the plastic sheet and, to prevent sticking, a sheet of cellophane was put between the platen and the lower surface of the polypropylene.

The press was closed, the pressure brought up to 200 p.s.i.g. and then, as the plastic flowed, the pressure gradually dropped off to 0 p.s.i.g. after which the laminate was removed from the press.

After the aluminum foil had been stripped by immersing the laminate in 30 percent hydrochloric acid for 10 minutes at 160°F., the surface was plated electrolessly with nickel and then electrolytically with copper using conventional techniques. The adherent, plated-metal coating exhibited an adhesion value of about 3 pounds per inch.

EXAMPLE V

A sheet of polypropylene having a thickness of 0.125 inch was laminated to an anodically treated aluminum sheet. (0.002 inch thickness) in the same manner as described in Example IV. After the aluminum foil had been removed by immersion in hydrochloric acid (40 percent by weight), the surface was painted with an acrylic base lacquer and then allowed to dry. The paint adhered strongly to the prepared surface and when adhesively coated tape was pressed against the paint surface and removed by pulling at a 90° angle, the painted coating remained intact on the substrate surface.

EXAMPLE VI

A laminate was prepared from a sheet of ABS (0.125 inch in thickness) and anodically treated aluminum foil (0.003 inch in thickness) in the same manner as described in Example IV, with the exception that the pressure utilized was 250 p.s.i.g. After stripping the aluminum from the laminate as described in Example IV, a part of the substrate was plated electrolessly with nickel and then electroplated with copper to yield a plated-metal substrate in which the metal coating had a peel strength of about 3 pounds per inch.

Another part of the substrate was painted with an acrylic base lacquer which on drying, adhered tightly to the treated surface.

Preparation of Printed Circuit Boards

In the procedure for preparing a circuit board, the metal-clad laminate utilized is one prepared as previously described in which the metal cladding is aluminum, bonded preferably to a thermoset resin by heat and pressure and having an anodically treated surface abutting the resin. In this case, the metal sheet or foil may be as thin as practical since this cladding will not be used for circuit forming purposes in accordance with the present invention, since it will be stripped or etched completely from the board prior to application of any circuit. Following the stripping of the aluminum cladding the substrate is catalyzed in a known manner in an electroless plating noble metal catalyst solution, and the board is processed in either of two ways to provide an adherent conductor metal circuit on its surface. Under one procedure, the catalyzed board is electrolessly plated with a thin, initial deposit of conductor metal over its entire surface, followed by application of a circuit pattern of suitable resist to permit subsequent build-up by electrolytic or electroless deposition in the circuit areas of additional conductor metal to final desired thickness. Alternatively, the procedure may involve applying and developing a resist circuit pattern immediately following catalyzing, and then plating the circuit areas only with conductive metal by electroless plating technique, or even by direct electrolytic plating in some circumstances as described for example in U.S. Pat. No. 3,099,608, Radovsky et al.

Both procedures just described are satisfactory, each having some inherent advantages that may make it preferable to some operators over the other in a particular application. For example, the first procedure mentioned provides a means of facilitating electrodeposition in the formation of the conductor circuit pattern, and this is inherently less expensive than electroless deposition procedures. However, using this method requires a final brief etching step to remove the initial thin continuous electroless deposit of conductive metal in non-circuit areas after the build-up of the circuit has been completed.

Whichever of the two procedures here described is employed, the circuit board is heated or baked at one or more points in its development to promote effective bonding between the conductor metal and the resin substrate. Such heating or baking operation can be carried out at any one or more points, e.g.: following the catalyzing step, after application of the continuous initial thin conductor metal layer; after application of the resist; after development of the resist circuit pattern; or after completion of the circuit board, depending on which procedure is used. While such heating or baking is not required at all of these stages, it is always required at least once following the catalyzing stage and is instrumental in obtaining good adhesion.

While the mechanisms of better adhesion through starting with an aluminum clad laminate and then chemically stripping all the metal away before electroless deposition or the coating process is begun is not yet well understood, it appears that some interaction involving or caused by the anodically treated surface on the aluminum foil at the metal-plastic interface during the formation of the plastic surface to be bonded and subsequent stripping of the anodically treated foil chemically is the reason for the greatly improved adhesion between the substrate and the coating, providing peel strengths of at least 5 and as high as 15 pounds per inch. It is believed that an essential aspect of the formation of a bondable surface is that the plastic is capable of flowing and conforming to the anodically treated surface. The heating or baking step mentioned above is, moreover, essential to the improved result. After the anodically treated aluminum cladding has been etched away, the result is a plastic substrate with a highly active surface which is water wettable.

What is claimed is:

1. An aluminum-clad laminate comprising a substrate selected from the group consisting of a preformed, self-supporting thermoset resin substrate and a preformed, self-supporting thermoplastic resin substrate, bonded to aluminum foil by heat and pressure, the surface of the aluminum foil abutting said substrate having been anodically treated in an electrolytic bath containing about 10 to about 60 weight percent of phosphoric acid for about 1 to about 30 minutes at a current density of about 10 to about 75 a.s.f.

2. The laminate of claim 1 wherein the said substrate is a thermoset resin substrate.

3. The laminate of claim 1 wherein the said substrate is a thermoplastic resin substrate.

4. The laminate of claim 2 wherein the thermoset resin is an epoxy resin reinforced with glass fiber.

5. The laminate of claim 2 wherein the thermoset resin is a phenolic resin reinforced with glass fiber.

6. The laminate of claim 3 wherein the said thermoplastic resin is polypropylene.

7. The laminate of claim 3 wherein the said thermoplastic resin is acrylonitrile-butadiene-styrene copolymer.

* * * * *